(12) United States Patent
Woo et al.

(10) Patent No.: US 9,865,677 B2
(45) Date of Patent: Jan. 9, 2018

(54) SUPER JUNCTION SEMICONDUCTOR DEVICE

(71) Applicant: Magnachip Semiconductor, Ltd., Cheongju-si (KR)

(72) Inventors: Hyuk Woo, Incheon-si (KR); Dae Byung Kim, Cheongju-si (KR); Chang Yong Choi, Seoul (KR); Ki Tae Kang, Gumi-si (KR); Kwang Yeon Jun, Bucheon-si (KR); Moon Soo Cho, Seoul (KR); Soon Tak Kwon, Seongnam-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/798,756

(22) Filed: Jul. 14, 2015

(65) Prior Publication Data

US 2016/0020273 A1    Jan. 21, 2016

(30) Foreign Application Priority Data

Jul. 18, 2014    (KR) .................... 10-2014-0091152

(51) Int. Cl.
*H01L 29/06*        (2006.01)
*H01L 29/78*        (2006.01)

(52) U.S. Cl.
CPC ...... *H01L 29/0634* (2013.01); *H01L 29/7811* (2013.01)

(58) Field of Classification Search
CPC .................................................. H01L 29/7811
See application file for complete search history.

(56) References Cited

U.S. PATENT DOCUMENTS

| 2002/0185705 A1* | 12/2002 | Saitoh | H01L 21/3247 257/492 |
| 2006/0255401 A1* | 11/2006 | Yang | H01L 29/407 257/328 |
| 2009/0236697 A1* | 9/2009 | Ono | H01L 29/0634 257/618 |
| 2014/0117437 A1* | 5/2014 | Willmeroth | H01L 29/7802 257/329 |

* cited by examiner

*Primary Examiner* — Bilkis Jahan
*Assistant Examiner* — Victor Barzykin
(74) *Attorney, Agent, or Firm* — NSIP Law

(57) ABSTRACT

Provided is a super junction semiconductor device. The super junction semiconductor device includes a vertical pillar region located in an active region and horizontal pillar regions located in a termination region that are connected with each other while simultaneously not floating the entire pillar region in the termination region. Thus, a charge compensation difference, generated among pillar regions, is caused to be offset, although the length of the termination region is relatively short.

23 Claims, 6 Drawing Sheets

SUPER JUNCTION SEMICONDUCTOR DEVICE

CROSS-REFERENCE TO RELATED APPLICATION(S)

This application claims the benefit under 35 USC 119(a) of Korean Patent Application No. 10-2014-0091152 filed on Jul. 18, 2014, in the Korean Intellectual Property Office, the entire disclosure of which is incorporated herein by reference for all purposes.

BACKGROUND

1. Field

The following description relates to a semiconductor device. The following description also relates to a super junction semiconductor device, including one cell as a whole by connecting with each other a pillar region of an active region and a pillar region formed in a termination region that surrounds the active region without floating.

2. Description of Related Art

In alternatives, a high voltage device and a high power device are used in a power IC device for electric power conversion and in an electric control system. For example, a planar gate type MOSFET is used frequently as an IC device.

A cross sectional diagram of a unit cell of a general planar gate type metal-oxide-semiconductor field-effect transistor (MOSFET) is shown as FIG. 1. A MOSFET is a type of transistor used for amplifying or switching electronic signals. In FIG. 1, a breakdown voltage of a device is determined by a depletion layer formed between a P+ and an N-Epi region by a voltage applied on a drain when a gate voltage and a source voltage are identical.

However, the planar gate type MOSFET is to be designed to sustain over certain thicknesses and concentrations for the N-Epi region, such as to sustain an electric field distribution namely, a breakdown voltage. However, it is difficult to have a component below a certain resistance because of the relationships with the electric field distribution. Especially in the case of a 500 V level MOSFET, such a device has a problem of on-resistance growing larger as a breakdown voltage increases because almost 90% of an on-resistance component is epi resistance. Although measures to improve design or optimize epi resistance are sought after in order to reduce on-resistance, such measures did not produce much improvement.

Thus, a semiconductor device having a super junction structure is proposed. A super junction semiconductor device is similar to a general MOSFET gate and a P-type WELL structure. However, a super junction semiconductor device has a structure of a P-type pillar region formed in an N-type epi layer of a lower P-type body region, and a remaining N-type epi layer becomes an N-type pillar region in order to have a super junction feature. Thus, when a voltage is applied on a drain side, unlike a general MOSFET, which only extends vertically, a depletion layer of the super junction semiconductor device extends both vertically and horizontally. At this time, when both regions become identical, both the N region and the P region become completely depleted, and hence are able to receive a high breakdown voltage. Also, in this example, a horizontal electric field is theoretically generated constantly since electric charge does not exist vertically.

However, when a pillar in floating state on termination region exists in a super junction semiconductor device, the level of charge compensation becomes different in comparison to the adjacent pillar.

Referring the example of FIG. 2, some pillars 12 among the pillars 12, 14 are formed on an N-type epi layer 2 of an N-type substrate 1, such that the pillars 12 are connected to a source contact region 10 and the rest of the pillars 14 are connected to a field oxide layer 20. The pillars 14 connected to the field oxide layer 20 are the pillars in a floating state. In other words, FIG. 2 shows the case of groups of pillars existing alone that are not connected with each other.

When a pillar 12 is in contact with a source contact region 10, a depletion region 30 is extended simultaneously between the pillars. Alternatively, when the pillars 14 are in a floating state as discussed, a depletion region is extending differently from each of pillars 14 as shown with respect to depletion region 40. Thus, when a charge is balanced to maximize the breakdown voltage of a pillar 12 in contact with a source contact region 10, a charge compensation level becomes different. Hence, a breakdown voltage, generated vertically in the region 30, becomes lower than the breakdown voltage generated vertically in the region 40.

To address this issue, a pillar that is currently in a floating state is connected so as not to be in a floating state. However, in this situation, the horizontal length of the termination region is required to be longer. When the horizontal length of the termination region is not extended, a difference in charge compensation occurs as discussed further above or a problem of failing to provide a sufficient breakdown voltage occurs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An object of the examples is to solve the problems discussed above by including all pillar regions formed on an active region and a termination region of a semiconductor device that are not floating, and causing all pillars in the entire pillar region to be connected with each other. Such an approach removes a charge compensation difference that is generated by floating, and hence, stably procures a vertically generated breakdown voltage.

Moreover, another purpose of the examples is to manufacture a small chip by not making a termination region length longer.

According to one general aspect, a super junction semiconductor device includes an active region, a vertical pillar region located on the active region, a first termination region and a second termination region located surrounding the active region, first horizontal pillar regions located on the first termination region, and second horizontal pillar regions located on the second termination region, wherein the first horizontal pillar regions, the second horizontal pillar regions, and the vertical pillar region are connected with each other.

The super junction semiconductor device may lack a pillar region in a floating state on the first termination region and the second termination region.

The first horizontal pillar regions, the second horizontal pillar regions and the vertical pillar region may be located on an epi layer.

The super junction semiconductor device may further include an oxide layer located on the epi layer surface, and a poly gate located on the oxide layer.

The poly gate may be located on an upper portion of the vertical pillar region.

The first horizontal pillar regions and the second horizontal pillar regions may be connected.

The first termination region and the second termination region may be connected horizontally.

The second horizontal pillar regions and the vertical pillar region may be connected.

A number of the first horizontal pillar regions and a number of the second horizontal pillar regions may be the same.

The first horizontal pillar regions and the second horizontal pillar regions may be formed successively in a vertical direction.

The first horizontal pillar regions or the second horizontal pillar regions may be formed horizontally, and the first horizontal pillar regions and the second horizontal pillar regions may be connected with each other.

The super junction semiconductor device may further include a connection structure in a vertical direction, formed by controlling at least one of thickness of the epi layer, length of an ion injection prevention mask, and length of a region where ion injection of a dopant is applied.

The super junction semiconductor device further comprising a connection structure in a vertical direction, formed by controlling at least one of a length of an ion injection prevention mask and a length of a region where ion injection of a dopant is applied.

In another general aspect, a super junction semiconductor device includes an active region, comprising a vertical pillar region and surrounded by a first termination region comprising first horizontal pillar regions and a second termination region comprising second horizontal pillar regions, wherein the first horizontal pillar regions, the second horizontal pillar regions, and the vertical pillar region are connected with each other.

The super junction semiconductor device may lack a pillar region in a floating state on the first termination region and the second termination region.

The first horizontal pillar regions, the second horizontal pillar regions and the vertical pillar region may be formed on an epi layer.

The super junction semiconductor device may further include an oxide layer located on the epi layer surface, and a poly gate located on the oxide layer.

The poly gate may be located on the upper vertical pillar region.

The first horizontal pillar regions and the second horizontal pillar regions may be connected.

The first termination region and the second termination region may be connected horizontally.

The second horizontal pillar regions and the vertical pillar region may be connected.

A number of the first horizontal pillar regions and a number of the second horizontal pillar regions may be the same.

A super junction semiconductor device according to the examples has the following effects.

The examples enable all pillar regions on a chip to be connected with each other by forming all pillar regions of a termination region in a semiconductor device without a floating section. Thus, all N-type horizontal epi regions are located in a depleted region and are able to offset a charge-compensation difference of pillar regions that is generated reciprocally. Thus, although a termination region length is shortened, a sufficient breakdown voltage of horizontal N-type epi layer is able to be procured.

Moreover, because termination region length are able to be shortened using this technology, smaller semiconductor device are able to be manufactured, are hence provide the following product with the advantages, such as improved performance and cost, that accompany the production of smaller semiconductor devices.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The examples provide a super junction semiconductor device providing for all pillars of a chip to be connected while not keeping in a floating state all of the pillars of a termination region. Such an approach increases horizontal electric field efficiency and stabilizes vertical breakdown voltage.

An example of a super junction semiconductor device is discussed further, with reference to the attached drawings.

Figure 1:
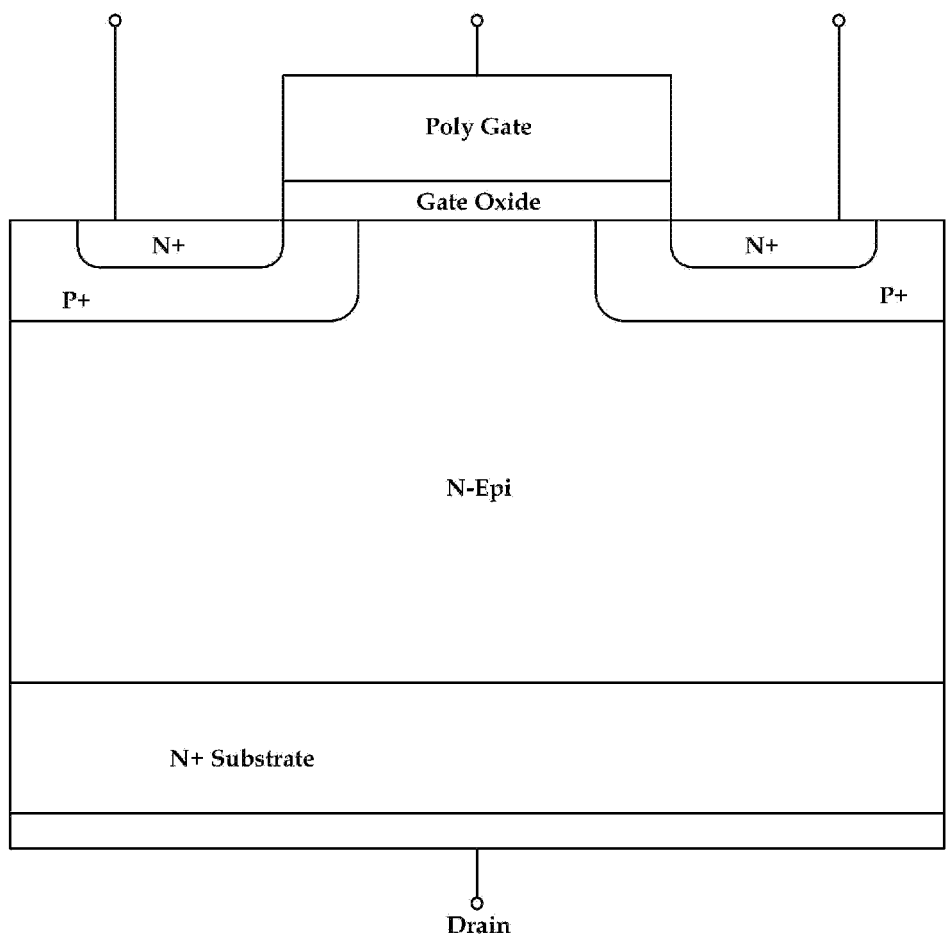
FIG. 1 is a cross sectional diagram of a general planar gate type MOSFET unit cell.
Figure 2:
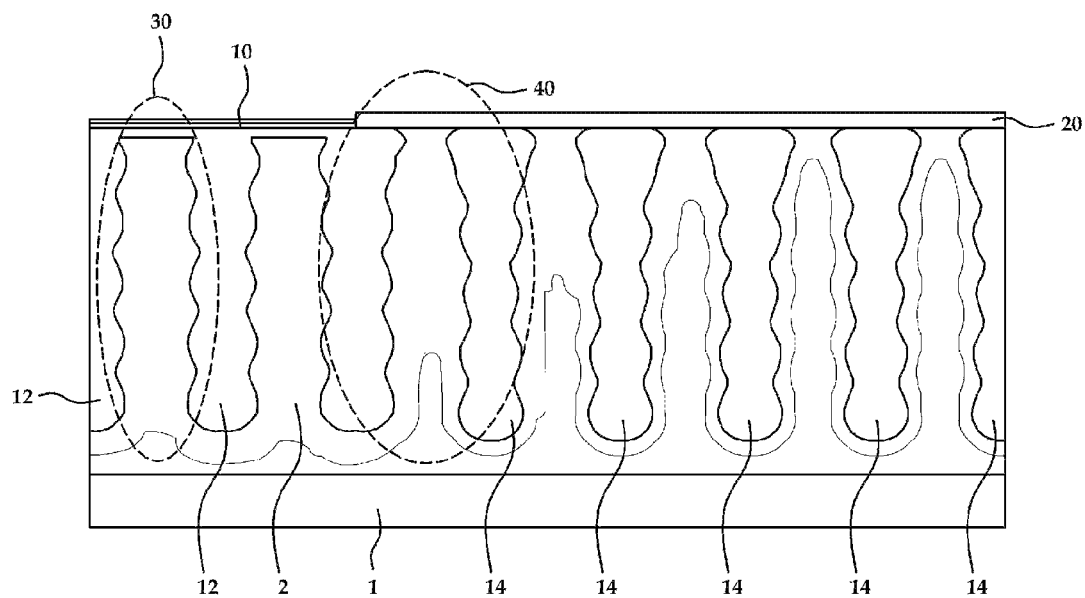
FIG. 2 is a cross sectional diagram illustrating a general super junction semiconductor device.
Figure 3:
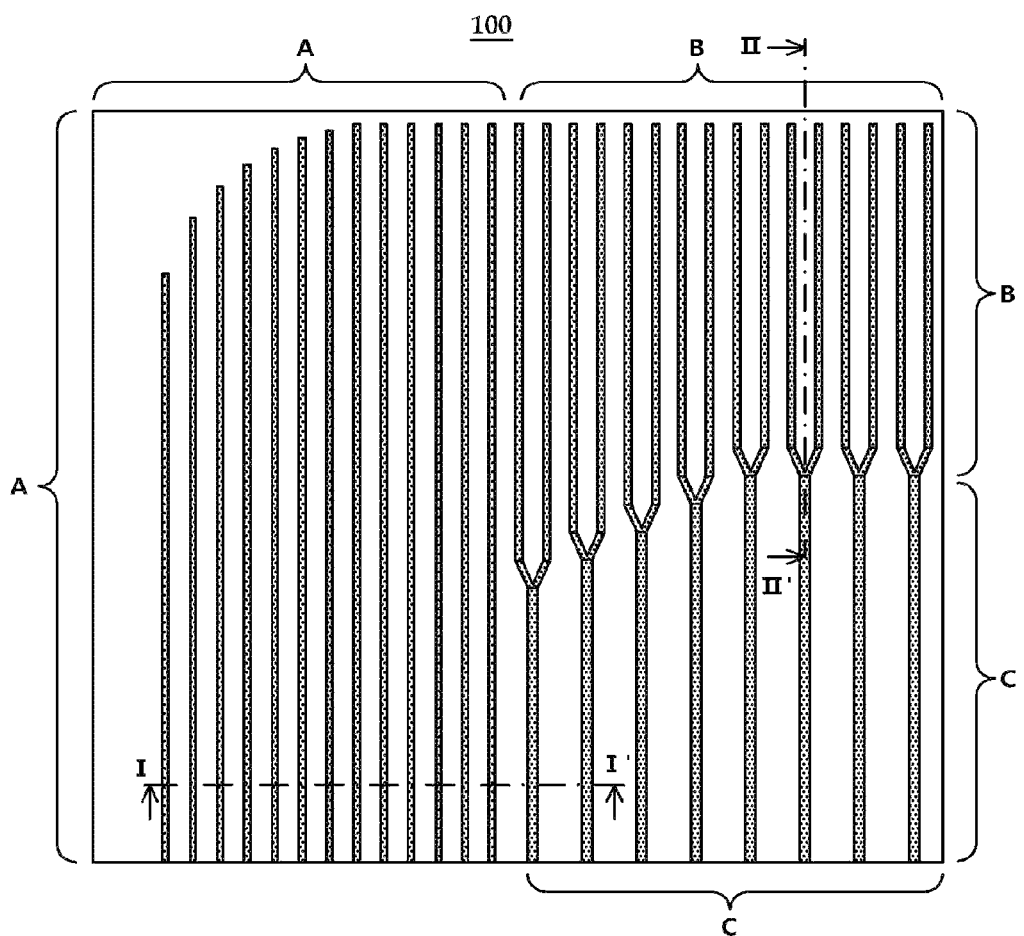
FIG. 3 is a plan view of a super junction semiconductor device according to an example.
Figure 4:
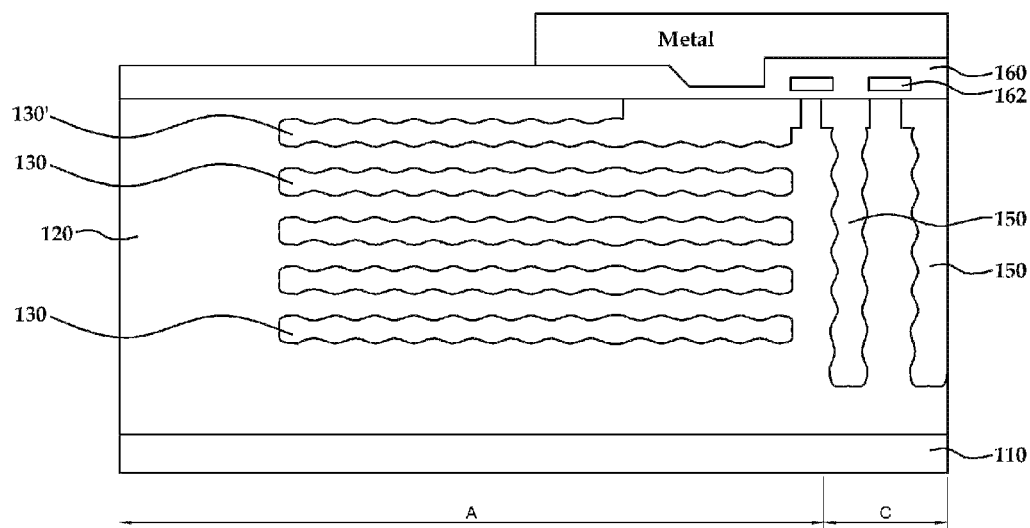
FIG. 4 is a line cross sectional diagram of I-I' of the example of FIG. 3.
Figure 5:
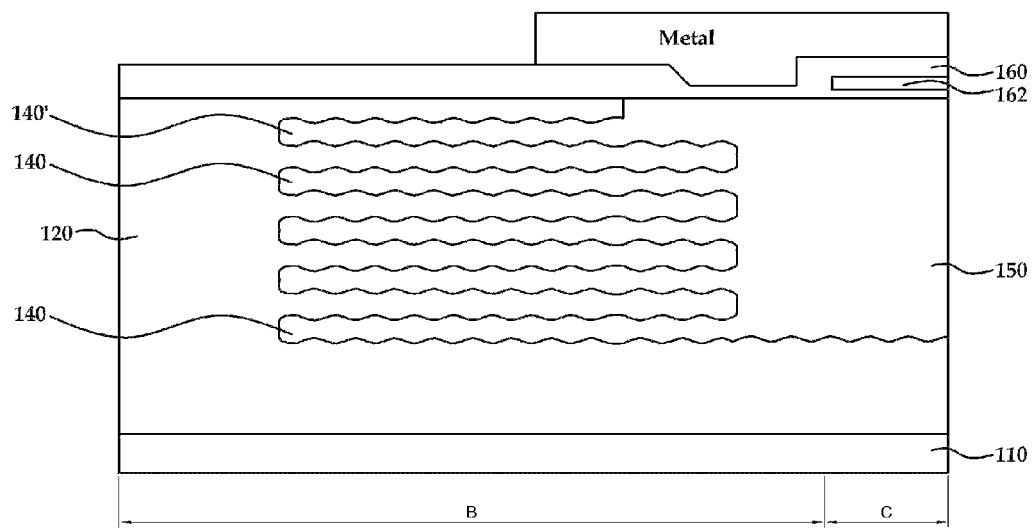
FIG. 5 is a line cross sectional diagram of II-II' of the example of FIG. 3.

FIG. 3 is a plan view of a super junction semiconductor device according to an example. FIG. 4 is a line cross sectional diagram of I-I' of the example of FIG. 3. FIG. 5 is a line cross sectional diagram of II-II' of the example of FIG. 3.

Referring to the example of FIG. 3, a super junction semiconductor device 100 includes an active region C and termination regions A, B that surrounds the active region C.

An active region C determines a drain-source resistance $R_{ds/on}$ of drain current flowing during current and during device turn-on operation. The termination regions A and B are supporting sections for breakdown voltage with respect to reverse voltages generated during device turn-off operation.

In the example of FIG. 3, termination regions A and B are differentiated into a first termination region A and a second termination region B. A first termination region A is a region that does not have a direct junction with a pillar region formed on an active region C, and a second termination region B is a region that has a direct junction with a pillar region formed on an active region C. Thus, a pillar region of a second termination region B and a pillar region of an active region C have a junction in a 'Y' form as shown in FIG. 3. However, different configurations and forms are applicable for the formation of the junction of pillars in lieu of the 'Y' form.

A P-type pillar region is formed on a first termination region A, a second termination region B and an active region C, and the P-type pillar region, which are all connected and included in one cell. The structure of the P-type pillar regions, which are all connected, is discussed further below with reference to the examples of FIG. 4 and FIG. 5.

In the example of FIG. 4, an N-type substrate 110 and an N-type epi layer 120 are formed. For example, an N-type epi layer 120 is formed on an N-type substrate 110. Additionally, an oxide layer 160 is formed on the N-type epi layer 120 surface. Also, a poly gate 162 is locally formed on the oxide layer 160.

For example, the N-type epi layer 120 is differentiated into a first termination region A and an active region C.

Figure 7:
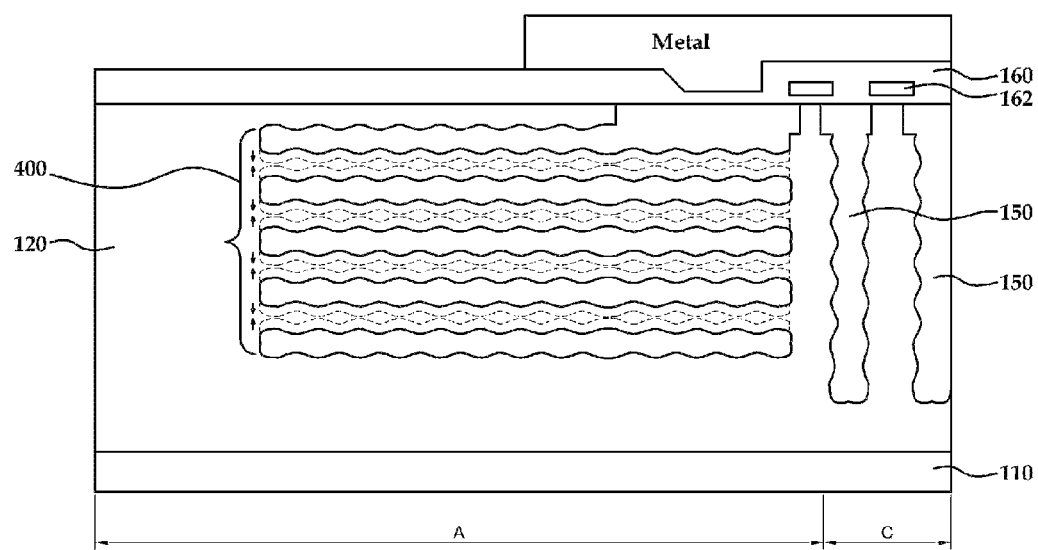
FIG. 7 is a cross sectional diagram of a super junction semiconductor device according to another example.

In the first termination region A, a plurality of P-type pillar regions 130, 130' are formed so as to be horizontally separated in a predetermined space that is referred to as a 'horizontal P-type pillar region.' Horizontal P-type pillar regions are formed in junctions, which are shown in FIG. 7. Horizontal P-type pillar regions 130, 130' are formed on an N-type epi layer 120 that is a region of an accumulated plurality of P-type ion injected regions. However, regions on an N-type epi layer 120 with no P-type ion injection become an N-type pillar region. Therefore, an N-type pillar region is accordingly formed between horizontal P-type pillar regions 130, 130'. Meanwhile, a net charge ratio of an N-type pillar and a P-type pillar of a horizontal pillar becomes identical with a net charge ratio of an N-type pillar and a P-type pillar of a vertical pillar.

In this example, the N-type pillar region and horizontal P-type pillar regions 130, 130' are arranged in parallel with an N-type substrate 110. Horizontal P-type pillar regions 130, 130' do not contact the N-type substrate 110.

Thus, the horizontal P-type pillar region 130' that contacts with an oxide layer 160 among horizontal P-type pillar regions 130, 130' controls an electric field horizontally in an N-type epi layer 120.

A plurality of P-type pillar regions 150 is formed vertically on an active region C. Such a plurality of P-type pillar regions 150 is referred to as a 'vertical P-type pillar region.' An N-type pillar region is formed between vertical P-type pillar regions 150.

The vertical P-type pillar regions 150 are to be arranged separately from an N-type substrate 110. This arrangement is because, when vertical P-type pillar region 150 is formed in an N-type substrate 110, a depletion region does not increase as an N-type substrate 110 is doped using an N-type dopant of very high concentration.

In the example of FIG. 4, horizontal P-type pillar regions 130, 130' on the first termination region A and vertical P-type pillar regions 150 formed on an active region C are deemed to be separated. However, when considered with respect to the corresponding portions of FIG. 5, horizontal P-type pillar regions 130, 130' are connected with P-type pillar regions 140, 140', 150 that are formed on the second termination region B, so in practice the horizontal P-type pillar regions 130, 130' and the P-type pillar regions 140, 140', 150 are all connected. In the example of FIG. 4, horizontal P-type pillar regions 130, 130' and vertical P-type pillar regions 150 are not only formed in separation, but are also potentially formed as junctions.

FIG. 5 is a line cross sectional diagram of II-II' of FIG. 3. In the example of FIG. 5, an N-type substrate 110 and an N-type epi layer 120 are formed.

An N-type epi layer 120 is differentiated into a second termination region B and an active region C.

For example, horizontal P-type pillar regions 140, 140' are formed on the second termination region B and a vertical P-type pillar region 150 is formed on an active region C.

In this example, the horizontal P-type pillar regions 140, 140' form junctions with a vertical P-type pillar region 150. Moreover, the horizontal P-type pillar regions 140, 140' and the vertical P-type pillar region 150 are placed to form junctions by methods of diffusion and other related methods. As discussed further with respect to FIG. 3, various methods are adaptable for a method of preparing such junctions.

According to such a structure, a horizontal P-type pillar region 130 of a first termination region A and a horizontal P-type pillar region 140 of a second termination region B are connected, and a horizontal P-type pillar region 140 of a second termination region B and a vertical P-type pillar region 150 of an active region C are connected. Thus, a horizontal P-type pillar region 130 of a first termination region A and a vertical P-type pillar region 150 of an active region C are connected with each other. Thus, all P-type pillar regions 130, 130', 140, 140', 150 on a first termination region A, a second termination region B, and an active region C are in a connected state with each other.

In such a manner, when all pillar regions of a semiconductor device are connected with each other, charge compensation generated by a floating section is removed, while also a termination region does not have to be long as would otherwise be required.

A method of forming a P-type pillar region is discussed further below.

Figure 6:
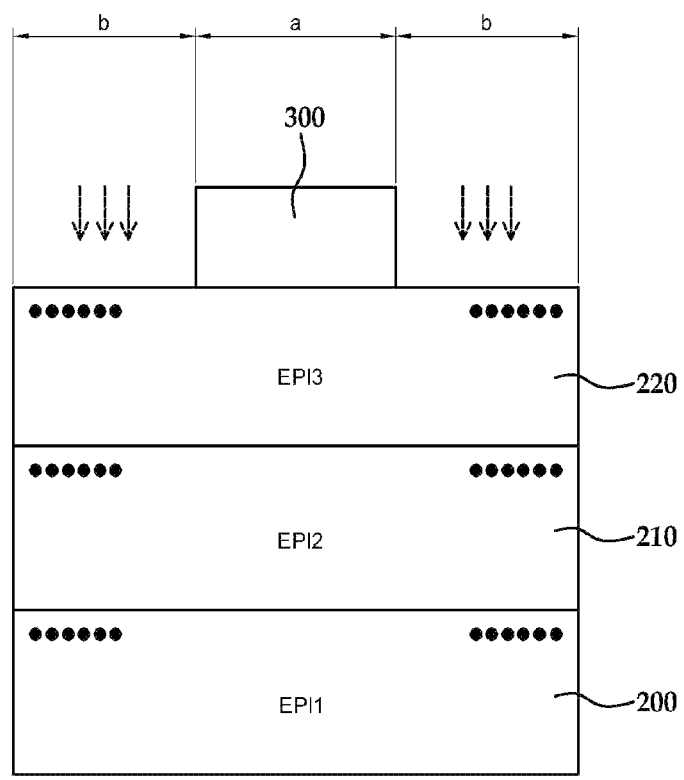
FIG. 6 is a schematic view illustrating a method of forming a P-type pillar region.

FIG. 6 is a schematic view illustrating a method of forming a P-type pillar region.

First of all, a first epi layer 200 is formed. When providing a mask 300 of predetermined length a on the first epi layer 200, the forming includes ion injecting P-type dopant in the arrow direction shown in FIG. 6. The ion injected region forms a remainder region b while excluding a mask 300, as the ions do not penetrate the mask 300. When the P-type dopant is injected, a second epi layer 210 is formed on a first epi layer 200 after removing the mask 300.

Next, the formation method includes forming another mask 300 on a second epi layer 210 and again ion injecting P-type dopant. The mask 300, herein, should be identical with a mask, used when injecting P-type dopant in a first epi layer 200, so that the same regions are masked. Moreover, the formation method removes a mask 300 and forms a third epi layer 220 again in a similar manner.

Thus, the formation method stacks multiple epi layers 200, 210, 220 in this way.

A number of epi layers 200, 210, 220 that are formed correspond with a number of horizontal P-type pillar regions that are intended to be included.

The epi layers 200, 210, 220 are all N-type epi layers. Accordingly, causing dopant concentration to all be the same is preferable since the epi layers 200, 210, 220 correspond to the N-type epi layer 120 of FIG. 4 and FIG. 5.

When epi layers 200, 210, 220 are stacked, the processing further includes heat treatment at a high temperature for P-type dopant diffusion. A P-type dopant injected in respective epi layers 200, 210, 220 according to a heat treatment process is diffused and a P-type pillar region is formed horizontally, so as to be long in length.

Likewise, after repeating a process of ion injecting P-type dopant on an N-type epi layer and again growing an N-type epi layer, a P-type pillar region is formed horizontally by processing using a heat treatment. Here, the P-type dopant is diffused upwards and downwards by a high temperature which is generated during epi layer growth and device manufacture process. Thus, a horizontal P-type pillar region is formed horizontally. As a result, a PN junction is formed in a curved form and not a straight line, which is the same for a P-type pillar region formed on an active region. In other words, this shape occurs because a P-type dopant diffuses towards left and right in a case of forming a PN junction.

Meanwhile, horizontal P-type pillars 130, 140 that are formed on a first termination region A and a second termination region B are configured to be in a vertical junction, which is possible in FIG. 6 when thickness of epi layers 200, 210, 220 and length a of a mask 300 and a dopant injection region b are controlled.

A horizontal P-type pillar region formed to have a junction upwards and downwards with respect to a first termination region A is shown in FIG. 7 by controlling thickness of epi layers 200, 210, 220, length of a mask 300, and length of dopant injection region b.

According to FIG. 7, respective P-type pillar regions that adjacent with each other diffuse in the directions shown as arrows and form junctions with each other.

Thus, P-type pillar regions under a surface of an upper and a lower side of an N-type epi layer 120 form junctions, each formed in one pillar region 400. However, since a depletion region exists horizontally on an N-type epi layer, horizontal breakdown voltage is stabilized. In other words, the example of FIG. 7 provides an identical effect as structure FIG. 4.

Likewise, an example forms a depletion region in an entire horizontal direction of an N-type epi layer and connects all pillar regions configured on an N-type epi layer of a semiconductor device, and thereby offsets a charge compensation difference which is generated between pillar regions. Thus, a desired breakdown voltage is obtained by such an approach although a termination region length is shortened.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation, Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A super junction semiconductor device comprising:
   a vertical pillar region located in an active region;
   a first termination region and a second termination region located surrounding the active region;
   first horizontal pillar regions located in the first termination region; and
   second horizontal pillar regions located in the second termination region,
   wherein the first horizontal pillar regions, the second horizontal pillar regions, and the vertical pillar region are connected, and
   wherein edges of the first horizontal pillar regions abut an epi layer.

2. The super junction semiconductor device of claim 1, wherein the super junction semiconductor device lacks a pillar region in a floating state in the first termination region and the second termination region.

3. The super junction semiconductor device of claim 1, wherein the first horizontal pillar regions, the second horizontal pillar regions and the vertical pillar region are located in the epi layer.

4. The super junction semiconductor device of claim 3, further comprising:
   an oxide layer located on the epi layer surface; and
   a poly gate located on the oxide layer.

5. The super junction semiconductor device of claim 4, wherein the poly gate is located on an upper portion of the vertical pillar region.

6. The super junction semiconductor device of claim 3, wherein the first horizontal pillar regions and the second horizontal pillar regions are connected.

7. The super junction semiconductor device of claim 6, wherein the first termination region and the second termination region are connected horizontally.

8. The super junction semiconductor device of claim 3, wherein
the second horizontal pillar regions and the vertical pillar region are connected.

9. The super junction semiconductor device of claim 3, wherein
a number of the first horizontal pillar regions and a number of the second horizontal pillar regions are the same.

10. The super junction semiconductor device of claim 1, wherein the first horizontal pillar regions and the second horizontal pillar regions are formed successively in a vertical direction.

11. The super junction semiconductor device of claim 1, wherein
the first horizontal pillar regions or the second horizontal pillar regions are formed horizontally, and the first horizontal pillar regions and the second horizontal pillar regions are connected.

12. The super junction semiconductor device of claim 11, further comprising a connection structure in a vertical direction, formed by controlling at least one of thickness of the epi layer, length of an ion injection prevention mask, and length of a region where ion injection of a dopant is applied.

13. The super junction semiconductor device of claim 7, further comprising a connection structure in a vertical direction, formed by controlling at least one of a length of an ion injection prevention mask and a length of a region where ion injection of a dopant is applied.

14. The super junction semiconductor device of claim 1, wherein the first horizontal pillar regions are spaced apart from the vertical pillar region.

15. The super junction semiconductor device of claim 14, wherein each of the second horizontal pillar regions is connected each to the other.

16. A super junction semiconductor device, comprising:
an active region comprising vertical pillar regions and surrounded by a first termination region comprising first horizontal pillar regions and a second termination region comprising second horizontal pillar regions,
wherein the first horizontal pillar regions, the second horizontal pillar regions, and the vertical pillar regions are connected,
wherein edges of the first horizontal pillar regions abut an epi layer, and
wherein the vertical pillar regions in the active region are spaced apart from the first horizontal pillar regions in the first termination region, respectively.

17. The super junction semiconductor device of claim 16, wherein the super junction semiconductor device lacks a pillar region in a floating state in the first termination region and the second termination region.

18. The super junction semiconductor device of claim 16, wherein the first horizontal pillar regions, the second horizontal pillar regions, and the vertical pillar regions are formed in the epi layer.

19. The super junction semiconductor device of claim 18, wherein an oxide layer is disposed above the epi layer surface, and the super junction semiconductor device further comprises a poly gate disposed on the oxide layer.

20. The super junction semiconductor device of claim 16, wherein a poly gate is disposed above the vertical pillar regions.

21. The super junction semiconductor device of claim 18, wherein the first horizontal pillar regions and the second horizontal pillar regions are connected.

22. The super junction semiconductor device of claim 21, wherein the first termination region and the second termination region are connected horizontally.

23. A super junction semiconductor device, comprising:
vertical pillar regions located in an active region;
first horizontal pillar regions located in a first termination region;
second horizontal pillar regions located in a second termination region; and
an epi layer comprising the first horizontal pillar regions, the second horizontal pillar regions, and the vertical pillar region; and
an oxide layer, in the first termination region, disposed contiguously on a portion of the epi layer,
wherein a top surface of an upper first horizontal pillar region of the first horizontal pillar regions abuts the epi layer and an oxide layer in the first termination region.

* * * * *